United States Patent
Hsieh et al.

(10) Patent No.: US 10,390,145 B1
(45) Date of Patent: Aug. 20, 2019

(54) MICRO ELECTRO MECHANICAL SYSTEM (MEMS) MICROPHONE

(71) Applicant: Solid State System Co., Ltd., Hsinchu (TW)

(72) Inventors: Tsung-Min Hsieh, New Taipei (TW); Cheng-Wei Tsai, Taichung (TW); Chien-Hsing Lee, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 0 days.

(21) Appl. No.: 15/943,637

(22) Filed: Apr. 2, 2018

(51) Int. Cl.
  *H04R 19/04* (2006.01)
  *H04R 1/08* (2006.01)
  *B81C 1/00* (2006.01)

(52) U.S. Cl.
  CPC ......... *H04R 19/04* (2013.01); *B81C 1/00158* (2013.01); *H04R 1/083* (2013.01); *B81B 2201/0257* (2013.01); *H04R 2201/003* (2013.01)

(58) Field of Classification Search
  CPC .............. H04R 19/04; H04R 2201/003; B81C 1/00158; B81B 2201/0257
  See application file for complete search history.

(56) References Cited

U.S. PATENT DOCUMENTS

| 2006/0210106 | A1 | 9/2006 | Pedersen | |
| 2007/0121972 | A1* | 5/2007 | Suzuki | B81B 3/0072 |
| | | | | 381/174 |
| 2015/0014797 | A1* | 1/2015 | Schelling | B81B 3/0059 |
| | | | | 257/416 |

FOREIGN PATENT DOCUMENTS

| TW | 201240475 | 10/2012 |
| TW | 201320778 | 5/2013 |

OTHER PUBLICATIONS

"Office Action of Taiwan Counterpart Application", dated Apr. 9, 2019, p. 1-p. 8.

* cited by examiner

*Primary Examiner* — Sonya D. McCall-Shepard
(74) *Attorney, Agent, or Firm* — JCIPRNET (57) ABSTRACT

A micro electro mechanical system (MEMS) microphone includes a substrate, having a substrate opening. A supporting dielectric layer is disposed on the substrate surrounding the substrate opening. A diaphragm is supported by the supporting dielectric layer above the substrate opening, wherein the diaphragm has a bowl-like structure being convex toward the substrate opening when the diaphragm is at an operation off state. A backplate is disposed on the supporting dielectric layer over the diaphragm, wherein the backplate includes a plurality of venting holes at a region corresponding to the substrate opening.

20 Claims, 12 Drawing Sheets

MICRO ELECTRO MECHANICAL SYSTEM (MEMS) MICROPHONE

BACKGROUND

1. Field of the Invention

The present invention generally relates to the micro-electro-mechanical-system (MEMS) technology and particularly to a MEMS microphone.

2. Description of Related Art

The MEMS device, such as MEMS microphone, has been popular due to the excellent features comparing to the conventional ECM microphone. The features of MEMS microphone include: thin and small size; SMD (surface mountable device) indicating easy assembly with sold flow; and high stability and environmental resistance. Particularly, a MEMS microphone with greatly reduced size is suitable for various applications.

As to sensing capability for the MEMS microphone, MEMS microphone includes a diaphragm capacitor, in which a diaphragm serving as a ground electrode can vibrate in response to the sound wave transmitted through the air medium. The variation of the capacitance corresponding to the source wave is then converted into electric signals for the backend circuit. In this mechanism, the vibrating performance of the diaphragm is a main factor to decide the sensing capability. In other words, the diaphragm plays an essential role for sensing the acoustic wave signal.

One factor to determine the capacitance of the diaphragm capacitor is the distance between the two electrode plates of the capacitor. However, the distance between the diaphragm serving as ground electrode and the backplate serving as a voltage electrode for the MEMS is usually small.

Further, the diaphragm is fixed at the periphery but the central region is the maximum region in vibrating capability. In other words, the diaphragm is not vibrating in uniform shift. This also causes the sensing distortion, not proportionally responding to the acoustic wave signal.

How to improve the sensing quality of the diaphragm capacitor is an essential issue in designing the MEMS microphone.

SUMMARY OF THE INVENTION

The invention is related to MEMS microphone. The diaphragm structure of the diaphragm capacitor is provided to reduce a sensing distortion and also increasing the capacitance.

In an embodiment, the invention provides a MEMS microphone. The MEMS microphone comprises a substrate, having a substrate opening. A supporting dielectric layer is disposed on the substrate surrounding the substrate opening. A diaphragm is supported by the supporting dielectric layer above the substrate opening, wherein the diaphragm has a bowl-like structure bending as a convex shape toward the substrate opening when the diaphragm is at an operation off state. A backplate is disposed on the supporting dielectric layer over the diaphragm, wherein the backplate comprises a plurality of venting holes at a region corresponding to the substrate opening.

In an embodiment, the invention provides a MEMS microphone. The MEMS microphone includes a substrate, having a substrate opening. A supporting dielectric layer is disposed on the substrate surrounding the substrate opening. A backplate is supported by the supporting dielectric layer over the substrate opening, wherein the backplate comprises a plurality of venting holes at a region corresponding to the substrate opening. A diaphragm is supported by the supporting dielectric layer over the backplate corresponding to the substrate opening, wherein the diaphragm has a bowl-like structure bending as a convex shape outward the substrate opening when the diaphragm is at an operation off state. A passivation layer is disposed on the supporting dielectric layer and having an opening corresponding to the substrate opening.

In an embodiment, the invention provides a micro electro mechanical system (MEMS) microphone.

In an embodiment, as to the MEMS microphone, the diaphragm is distant from the backplate by a first gap at a region supported by the supporting dielectric layer, and a convex tip of the convex shape of the diaphragm is distant from the backplate by a second gap, wherein the second gap is equal to or larger than 5/4 times of the first gap.

In an embodiment, as to the MEMS microphone, the larger a diameter of the diaphragm, the larger the second gap is.

In an embodiment, as to the MEMS microphone, a periphery region of the diaphragm has a spring structure.

In an embodiment, as to the MEMS microphone, the spring structure is a meandering structure extending from a central region of the diaphragm to a sidewall of the supporting dielectric layer.

In an embodiment, as to the MEMS microphone, a peripheral region of the diaphragm has a plural of slit openings, so to form the spring structure.

In an embodiment, as to the MEMS microphone, the backplate comprises a passivation layer, a peripheral region of the passivation layer is disposed on the supporting dielectric layer.

In an embodiment, as to the MEMS microphone, the diaphragm is conductive.

In an embodiment, as to the MEMS microphone, the diaphragm is connected to a ground terminal and a conductive layer of the backplate corresponding to the substrate opening is connected to an operation voltage.

In an embodiment, as to the MEMS microphone, the diaphragm comprises a plurality of sublayers in stack to produce a stress force, so to form the bowl-like structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention provides a MEMS microphone with improved performance for the diaphragm.

Several embodiments are provided for describing the invention but the invention is not limited to the embodiments.

Figure 1:
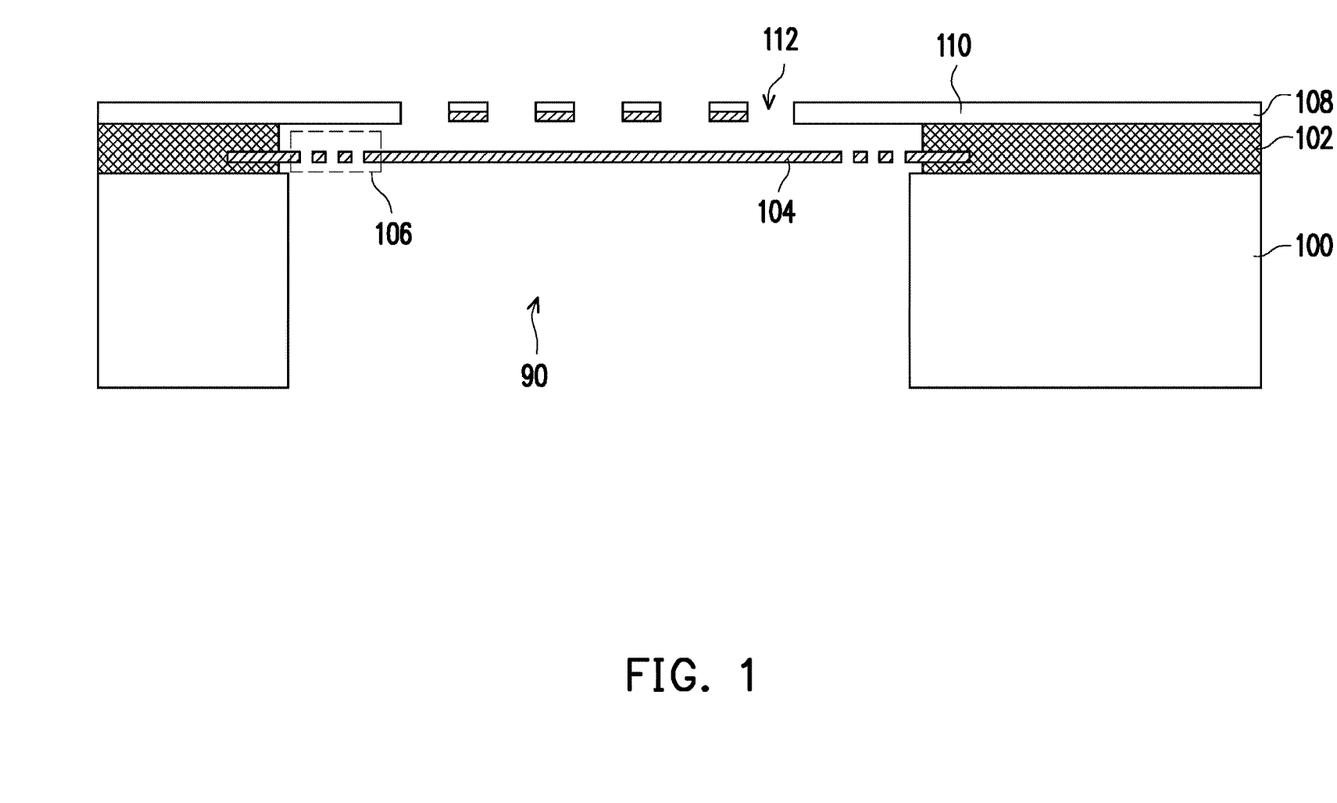
FIG. 1 is a drawing, schematically illustrating a cross-sectional view of a structure of MEMS microphone, according to an embodiment of the invention.

FIG. 1 is a drawing, schematically illustrating a cross-sectional view of a structure of MEMS microphone, according to an embodiment of the invention. In FIG. 1, the invention has looked into a usual MEMS microphone which includes a substrate 100, such as silicon substrate, having a substrate opening 90. A supporting dielectric layer 102 is disposed on the substrate 100 surrounding the substrate opening 90. A diaphragm 104 is supported by the supporting dielectric layer 102 above the substrate opening 90. The diaphragm 104 in this embodiment is a flat plane when the diaphragm 104 is at an operation off state. A backplate 110 is disposed on the supporting dielectric layer 102 over the diaphragm 104. the backplate 110 comprises a plurality of venting holes 112 at a region corresponding to the substrate opening 90. The backplate 110 also includes the passivation layer 108 and a conductive layer on the passivation layer 108 as integrated. The passivation layer 108 is disposed on the supporting dielectric layer 102. The diaphragm 104 can also include a spring structure 106, which at least allows the diaphragm 104 to more freely vibrate in response to the acoustic wave signal and also prevent a break at the joint portion to the supporting dielectric layer 102.

Figure 2:
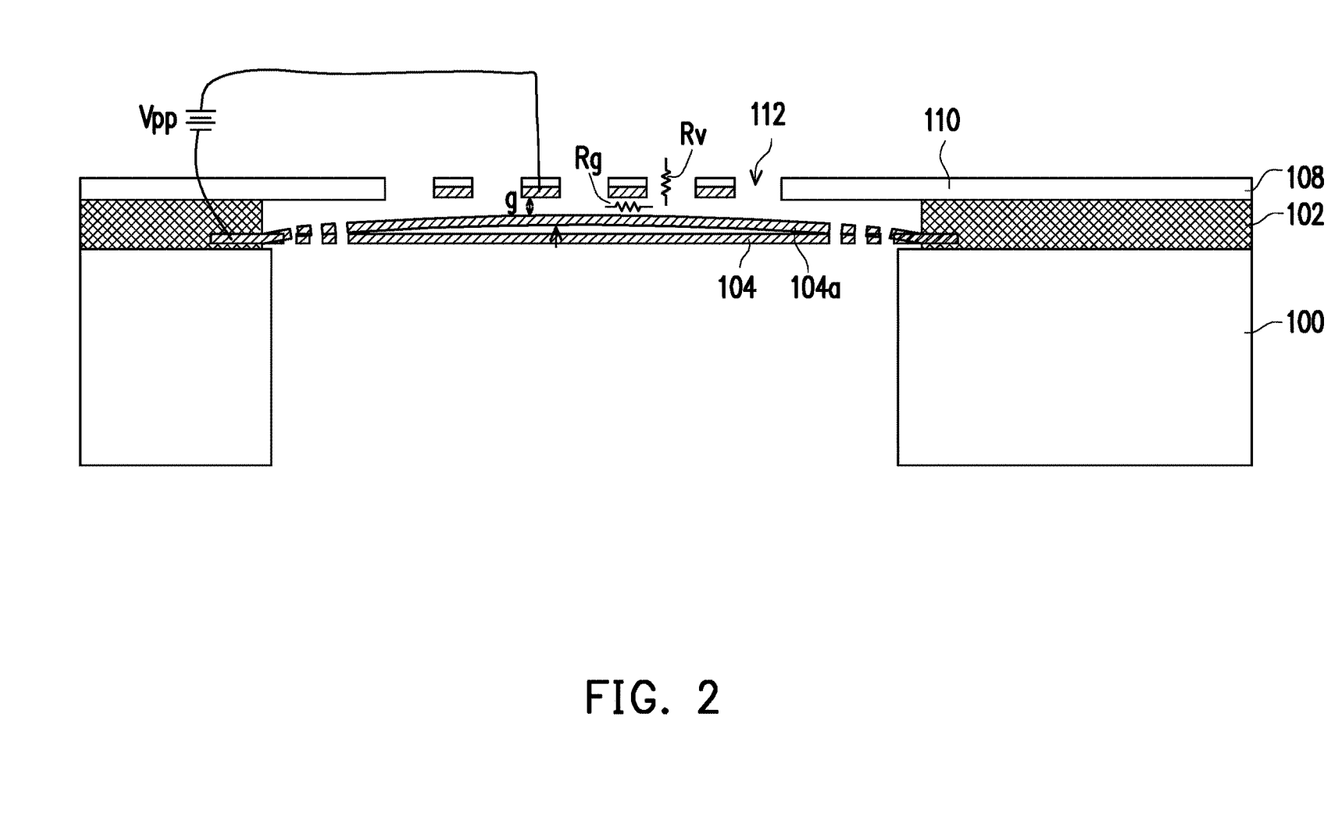
FIG. 2 is a drawing, schematically illustrating a cross-sectional view of a structure of MEMS microphone in operation, according to an embodiment of the invention.

FIG. 2 is a drawing, schematically illustrating a cross-sectional view of a structure of MEMS microphone in operation, according to an embodiment of the invention. In FIG. 2, by a straightforward way to form the diaphragm 104 of the MEMS microphone, the diaphragm 104 usually is a structure extending in a flat plane. In this structure of the diaphragm 104, some issues have been observed after looking into the MEMS microphone in the invention, in which the diaphragm 104 is bent toward the backplate 110 as shown by the state of the diaphragm 104a while applying operation bias Vpp between the diaphragm 104 and the backplate 110. The bending phenomenon is induced because of the flexibility of the diaphragm 104 induced by the electric field between the diaphragm 104 and the backplate 110.

In circuit point of view, the total impedance $R_{air}$ of the diaphragm capacity is a summation of a vertical resistance Rv and a gap resistance Rg, as expressed by an equation of $R_{air}$=Rg+Rv. The thermal noise is also depending on the total impedance $R_{air}$. It is also noted that Rg is proportional to $1/g^3$, g is the air gap. To decrease the thermal noise for higher SNR, air gap g should be large after the operation voltage Vpp is applied on the MEMS microphone.

In a way to increase the air gap g, the supporting dielectric layer 102 can be the thicker. However, the thicker dielectric layer, such as greater than 4 microns, would easily crack during the dielectric deposition. Additionally, if the diaphragm area is enlarged for high SNR, the air gap has to increase so to adapt the same pull-in voltage due to the decrease of membrane stiffness. Therefore, to obtain high SNR, the fabrication process would be more complicated for the current flat diaphragm.

Figure 3:
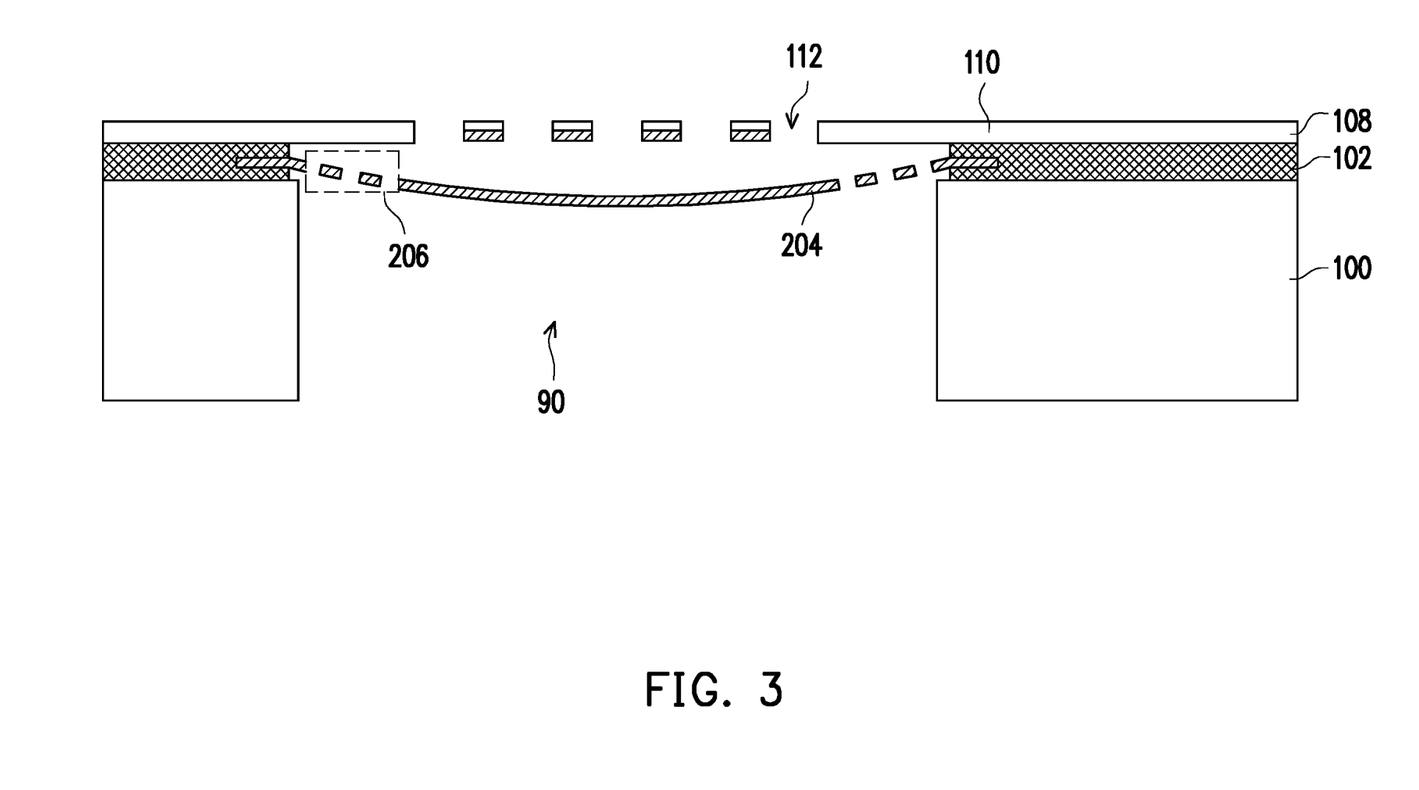
FIG. 3 is a drawing, schematically illustrating a cross-sectional view of a structure of MEMS microphone, according to an embodiment of the invention.

FIG. 3 is a drawing, schematically illustrating a cross-sectional view of a structure of MEMS microphone, according to an embodiment of the invention. In FIG. 3, to increase the air gap between the diaphragm 104 and the backplate 110, the diaphragm 204 in this embodiment at operation off state can have a bowl-like shape, resulting in a larger gap at the center region of the diaphragm 204. In the embodiment, the spring structure 206 is also formed at the peripheral region to join the supporting dielectric layer 102. Further, the strength of the spring structure 206 is depending on the geometric condition of the spring structure. The spring strength as intended then can be adjusted by setting the geometric condition of the spring structure. As noted, if the spring strength is too low, the performance of the diaphragm 204 may be influenced.

The bowl-like diaphragm 204 can be formed by controlling the deposition of membrane material to form a film having a gradual stress. In other words, the diaphragm 204 is stacked by multiple sub-layers with gradually changing stress. After the diaphragm 204 is released by removing the dielectric materials corresponding to the substrate opening 90, the diaphragm, 204 with the grading stress distributed in the sub-layers forms a bowl-like diaphragm 204. As a result, the diaphragm 204 has the bowl-like structure, being convex toward the substrate opening 90. The bowl-like diaphragm 204 has a larger gap at the center region without increasing the dielectric thickness between diaphragm 204 and the backplate 110.

Figure 4:
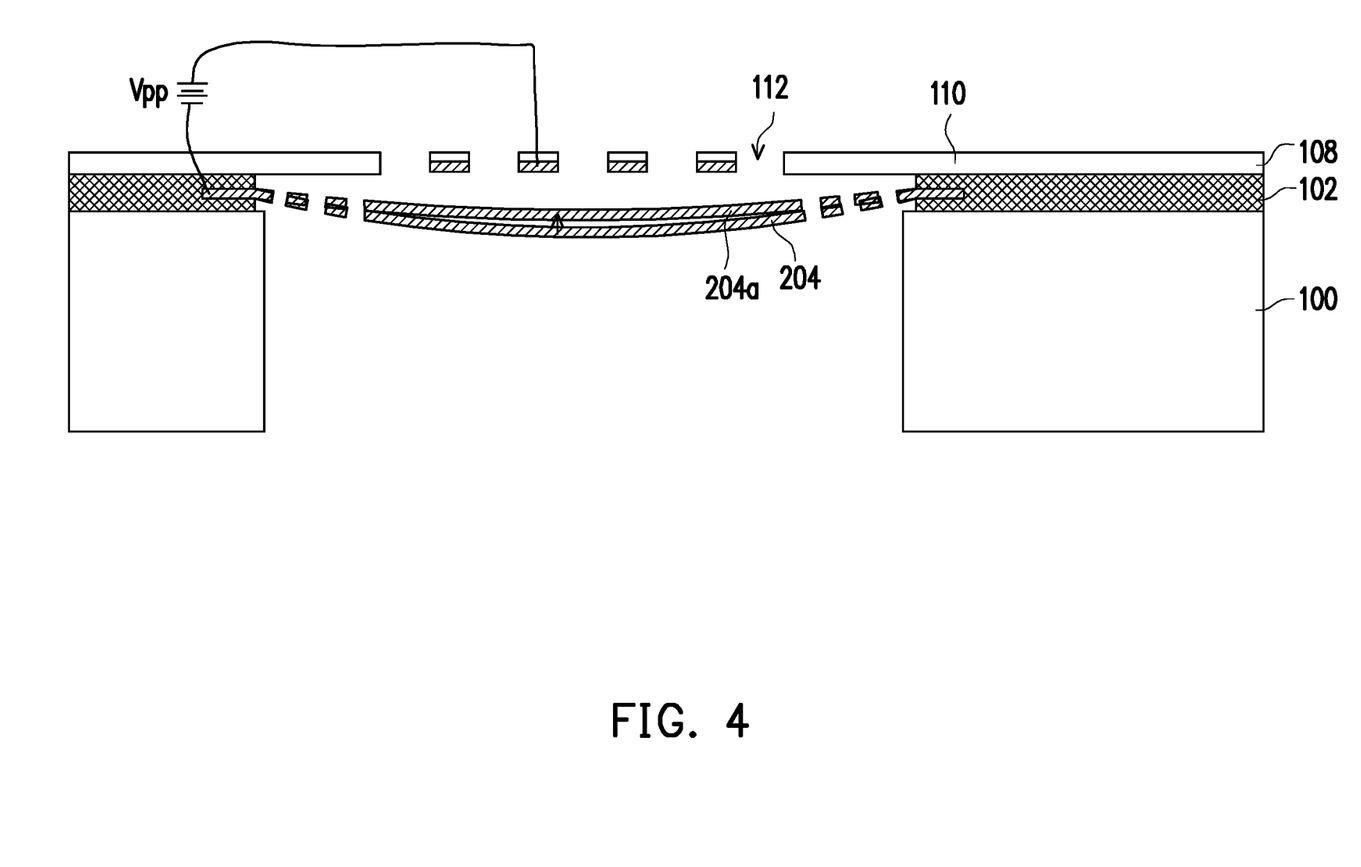
FIG. 4 is a drawing, schematically illustrating a cross-sectional view of a structure of MEMS microphone in operation, according to an embodiment of the invention.

FIG. 4 is a drawing, schematically illustrating a cross-sectional view of a structure of MEMS microphone in operation, according to an embodiment of the invention. In FIG. 4, as to the operation, the operation voltage Vpp is applied between the diaphragm 204 and the backplate 110. Since the diaphragm 204 has the bowl-like structure, being convex toward the substrate opening 90, after the operation voltage Vpp is applied, the diaphragm 204 is attracted by the backplate 110 to the position as indicated by the diaphragm 204a. However, the bowl-like structure still remains.

Figure 5:
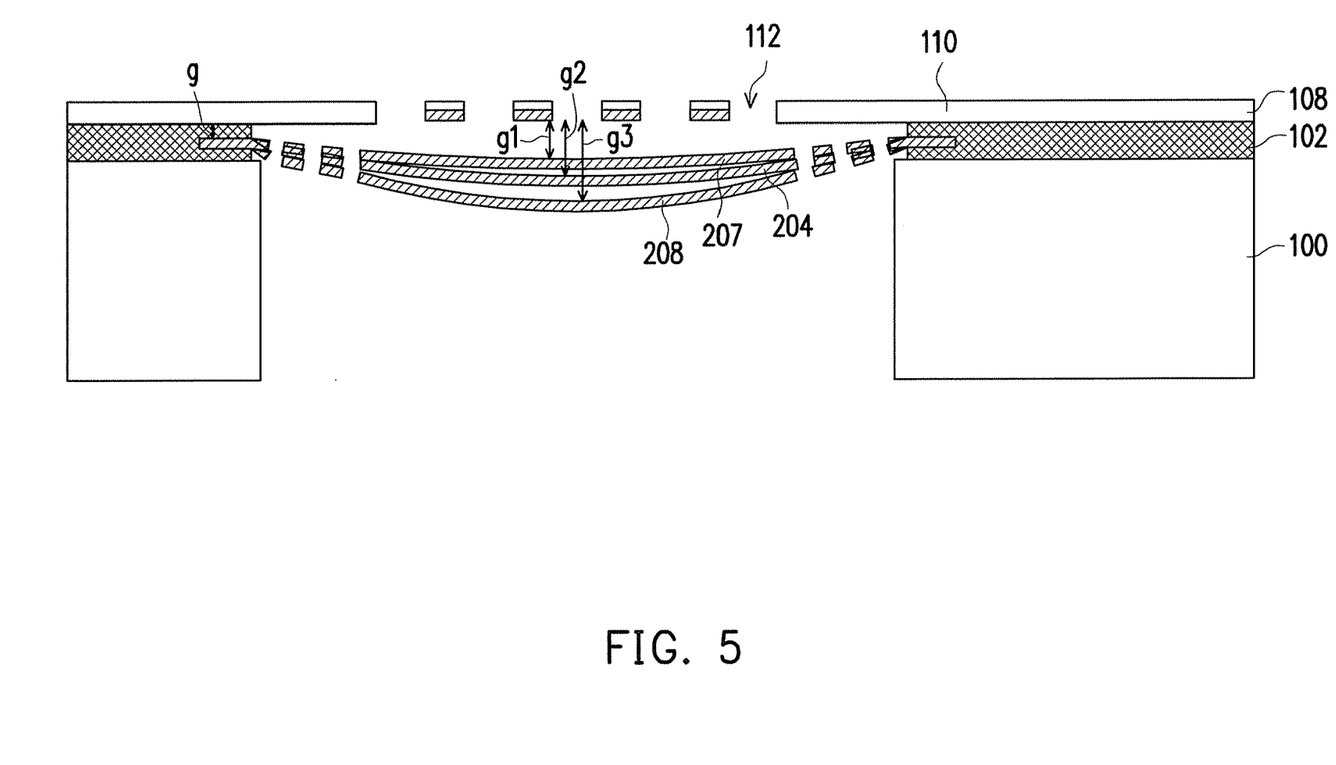
FIG. 5 is a drawing, schematically illustrating a cross-sectional view of a structure of MEMS microphone, according to an embodiment of the invention.

FIG. 5 is a drawing, schematically illustrating a cross-sectional view of a structure of MEMS microphone, according to an embodiment of the invention. In FIG. 5, as to the bowl-like structure for the diaphragm 204, it can be adjusted according to the actual design. The air gap g, also called a reference bowl depth, with respect to the flat diaphragm is defined by a gap between the diaphragm 204 and the backplate 110 in the region embedded in the supporting dielectric layer 102. The diaphragm 204 has the bowl depth g2. As adjusted, the diaphragm 207 can have less bowl depth g1 and the diaphragm 208 can have larger bowl depth g3.

However, in an embodiment, the bowl depth g1 in an embodiment can be 5/4 (=1+1/4) g or larger.

Figure 6:
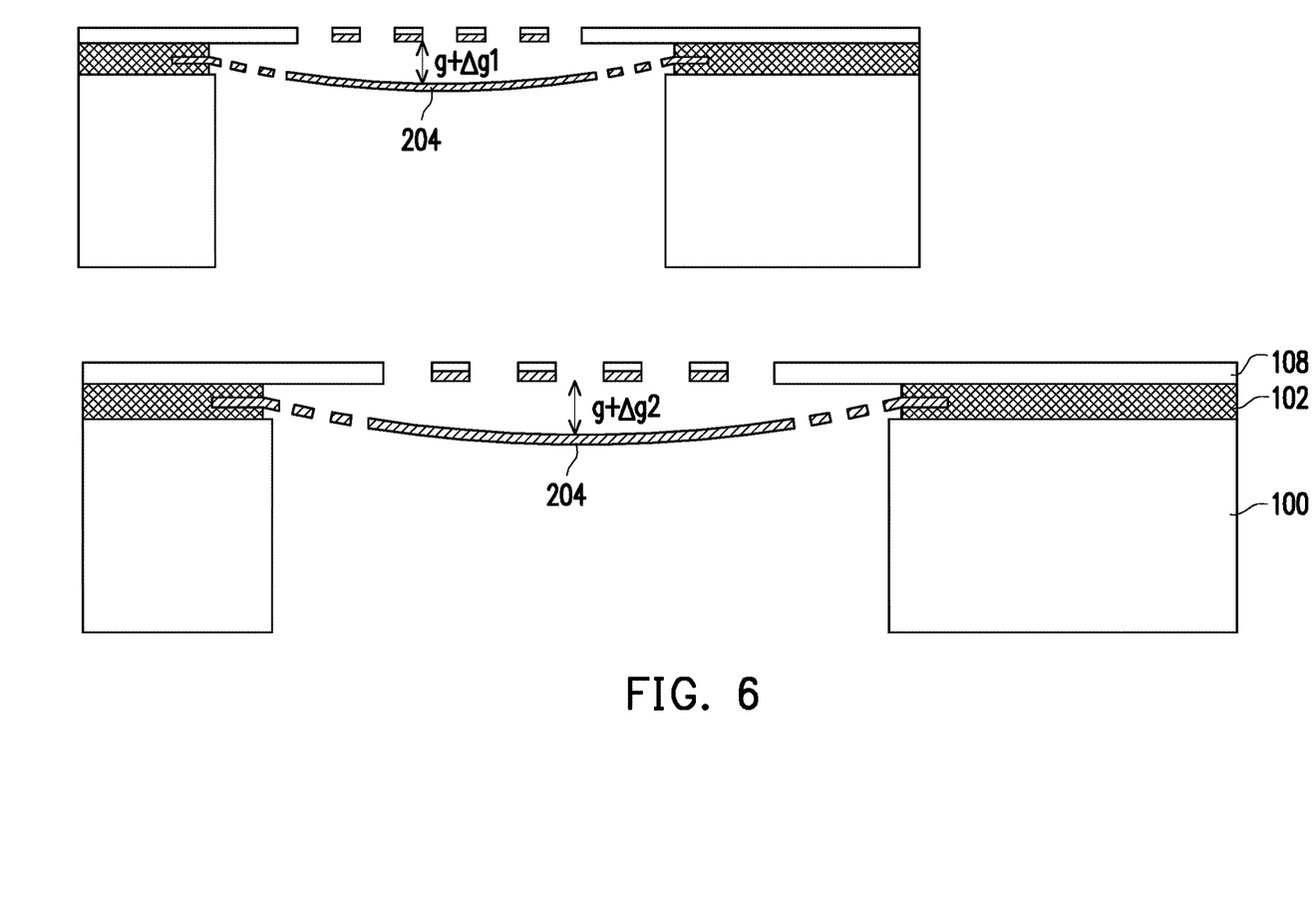
FIG. 6 is a drawing, schematically illustrating a cross-sectional view of a structure of MEMS microphone in different sizes, according to an embodiment of the invention.

FIG. 6 is a drawing, schematically illustrating a cross-sectional view of a structure of MEMS microphone in different sizes, according to an embodiment of the invention. In FIG. 6, additionally, the bowl depth is also needed to be adjusted according to the size of the diaphragm 204. Basically, a larger size of the diaphragm 204 has a larger diameter. The diaphragm 204 by a relatively smaller diameter has the air gap g and the additional indent Δg1, so to have the bowl depth g+Δg1. Likewise, the diaphragm 204 by a relatively larger diameter has the air gap g and the additional indent Δg2, so to have the bowl depth g+Δg2. The larger diaphragm is more flexible, so the quantity of Δg2 generally is larger than the quantity of Δg1.

Figure 7:
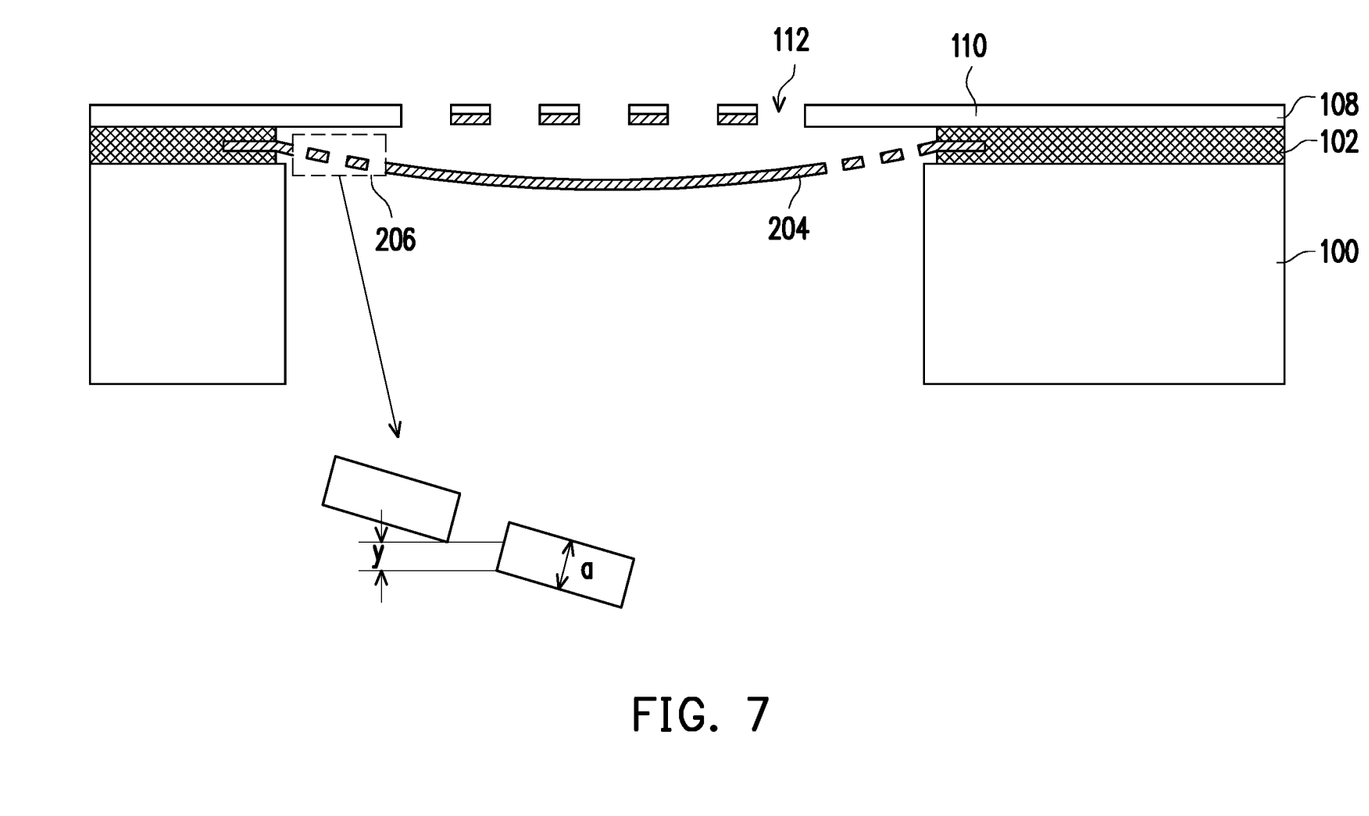
FIG. 7 is a drawing, schematically illustrating a cross-sectional view of a structure of MEMS microphone with the peripheral spring, according to an embodiment of the invention.

FIG. 7 is a drawing, schematically illustrating a cross-sectional view of a structure of MEMS microphone with the peripheral spring, according to an embodiment of the invention. In FIG. 7, the diaphragm 204 also has a spring structure 206 to improve the performance of the diaphragm in vibration. Also, the spring structure can also reduce the possibility of breaking at the region held by the supporting dielectric layer 102. However, if the spring is too soft, then the spring effect may not be able to maintain. Generally, the displacement y of adjacent beams of the spring 206 structure is not larger than the thickness a of the diaphragm 204, so to avoid the acoustic sensitivity drop in low frequency. As also noted, the bowl depths g1, g2 and g3 are referring to a distance from a convex tip of the diaphragm 204 to the backplate, in which the convex tip usually is located at the center of the diaphragm 204. In an example for the cross-section view, the adjacent two parts of the spring at a slant state have a shift y, which is not larger than the thickness of the diaphragm 204.

Figure 8A:
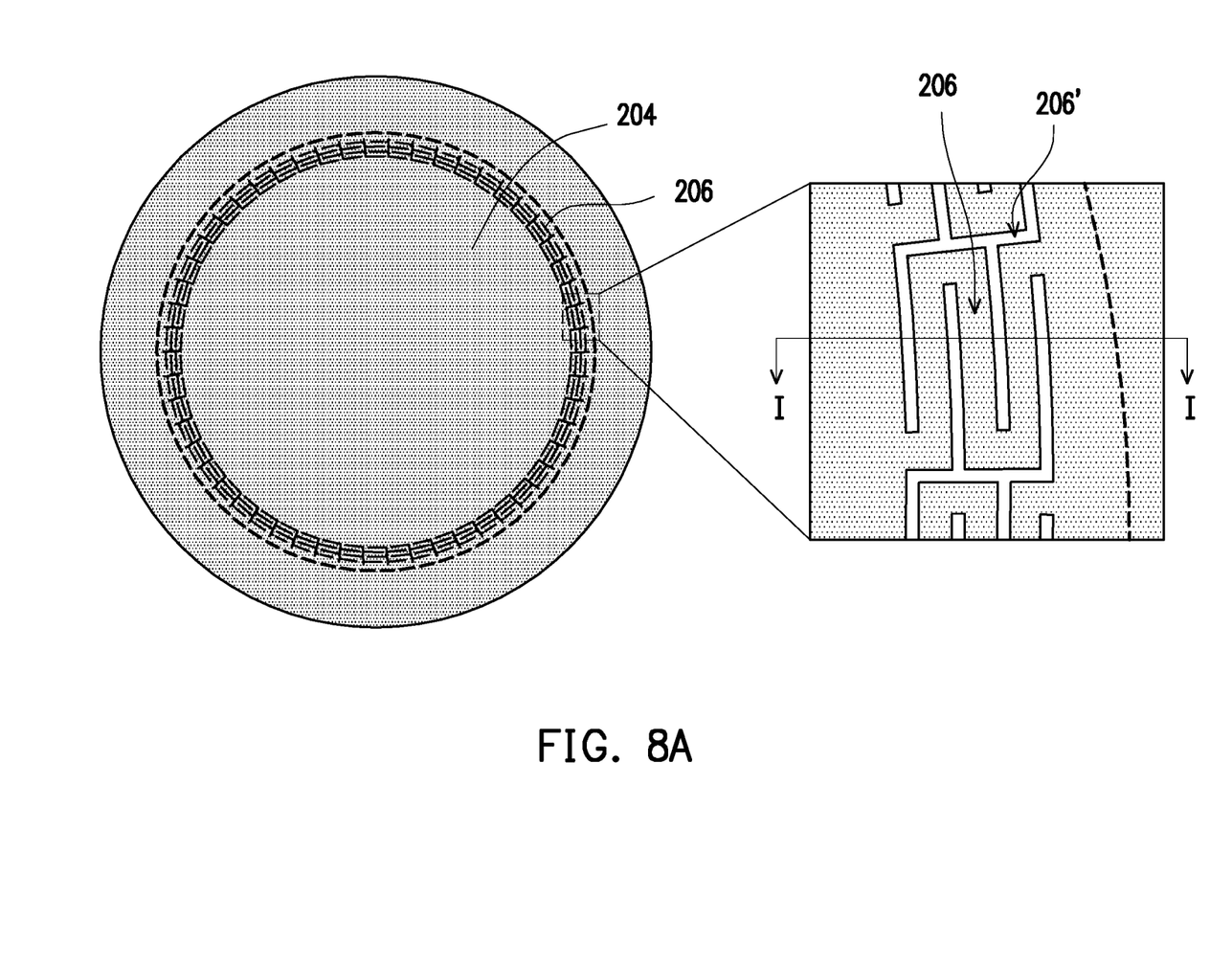
FIG. 8A is a drawing, schematically illustrating a top view of a spring structure of the MEMS microphone, according to an embodiment of the invention.

FIG. 8A is a drawing, schematically illustrating a top view of a spring structure of the MEMS microphone, according to an embodiment of the invention. In FIG. 8A, the spring structure 206 is shown from top view. The bowl-like diaphragm 204 is supported by a plurality of springs, which meander from the central region to the periphery at the sidewall of the supporting dielectric layer 102. Such springs can reduce the stress of the boundary between the diaphragm 204 and the supporting dielectric layer 102. The peripheral region out of the spring structure 206 is the region embedded in the supporting dielectric layer 102.

Figure 8B:
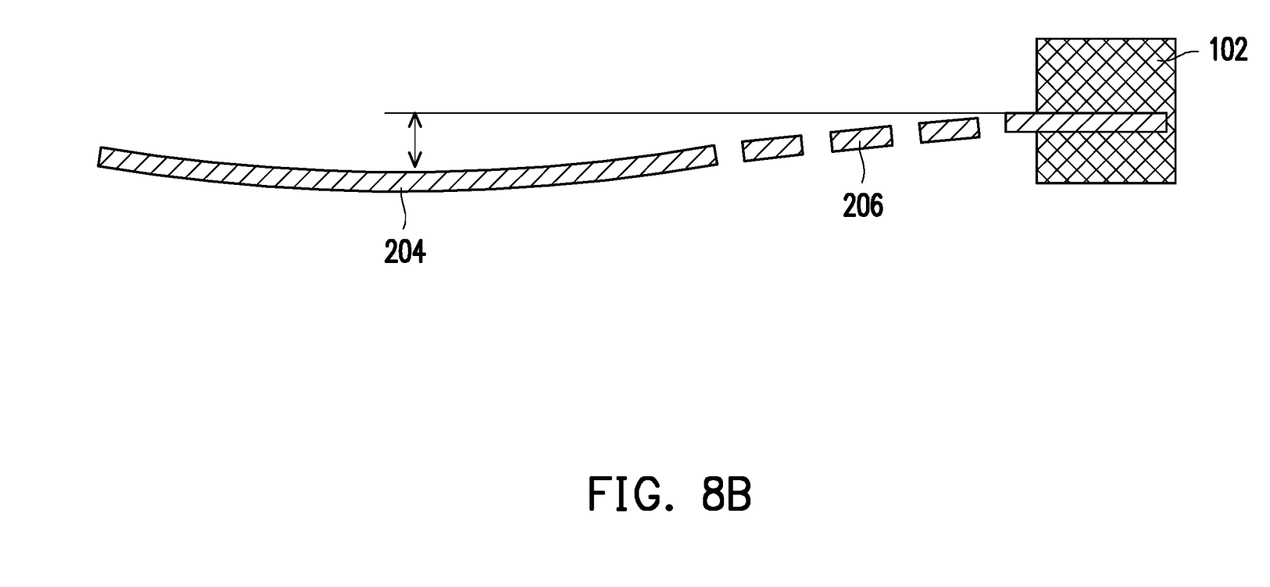
FIG. 8B is a drawing, schematically illustrating a cross-sectional view of the diaphragm of the MEMS microphone, according to an embodiment of the invention.

FIG. 8B is a drawing, schematically illustrating a cross-sectional view of the diaphragm of the MEMS microphone, according to an embodiment of the invention. In FIG. 8B, it is the cross-sectional structure in FIG. 8A as cut along the line I-I. Due to the meandering structure of the spring structure 206, the multiple beams are shown in the cross-sectional structure.

Figure 9:
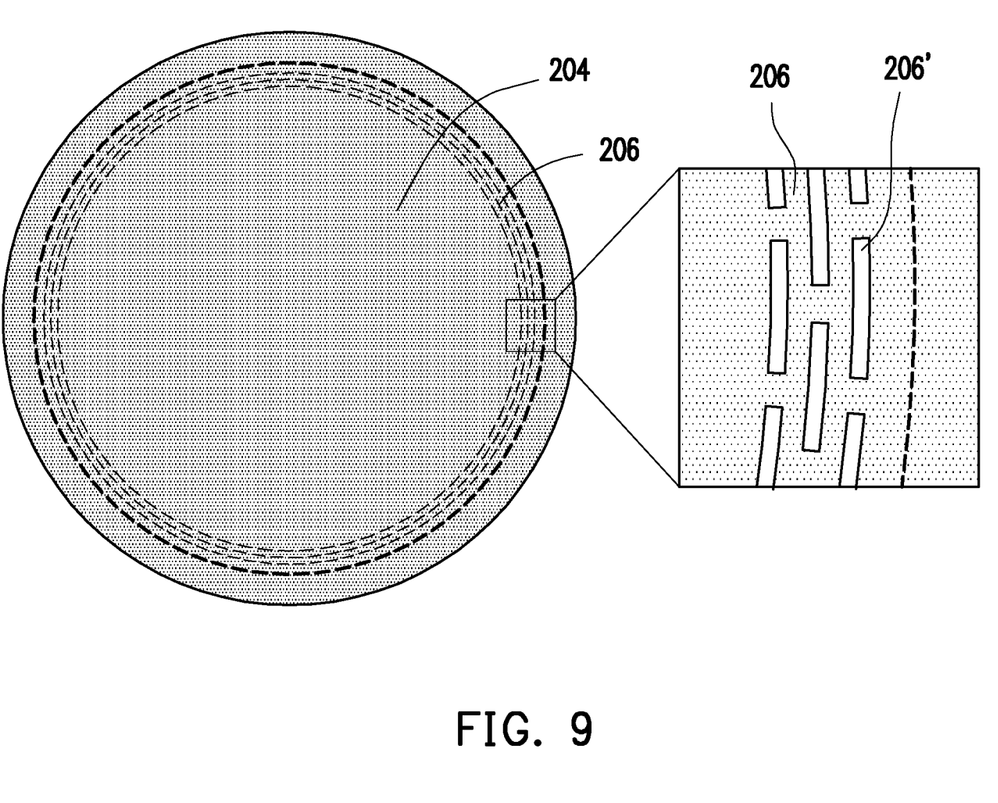
FIG. 9 and FIG. 10 are a drawing, schematically illustrating a top view of the diaphragm of the MEMS microphone, according to an embodiment of the invention.
Figure 10:
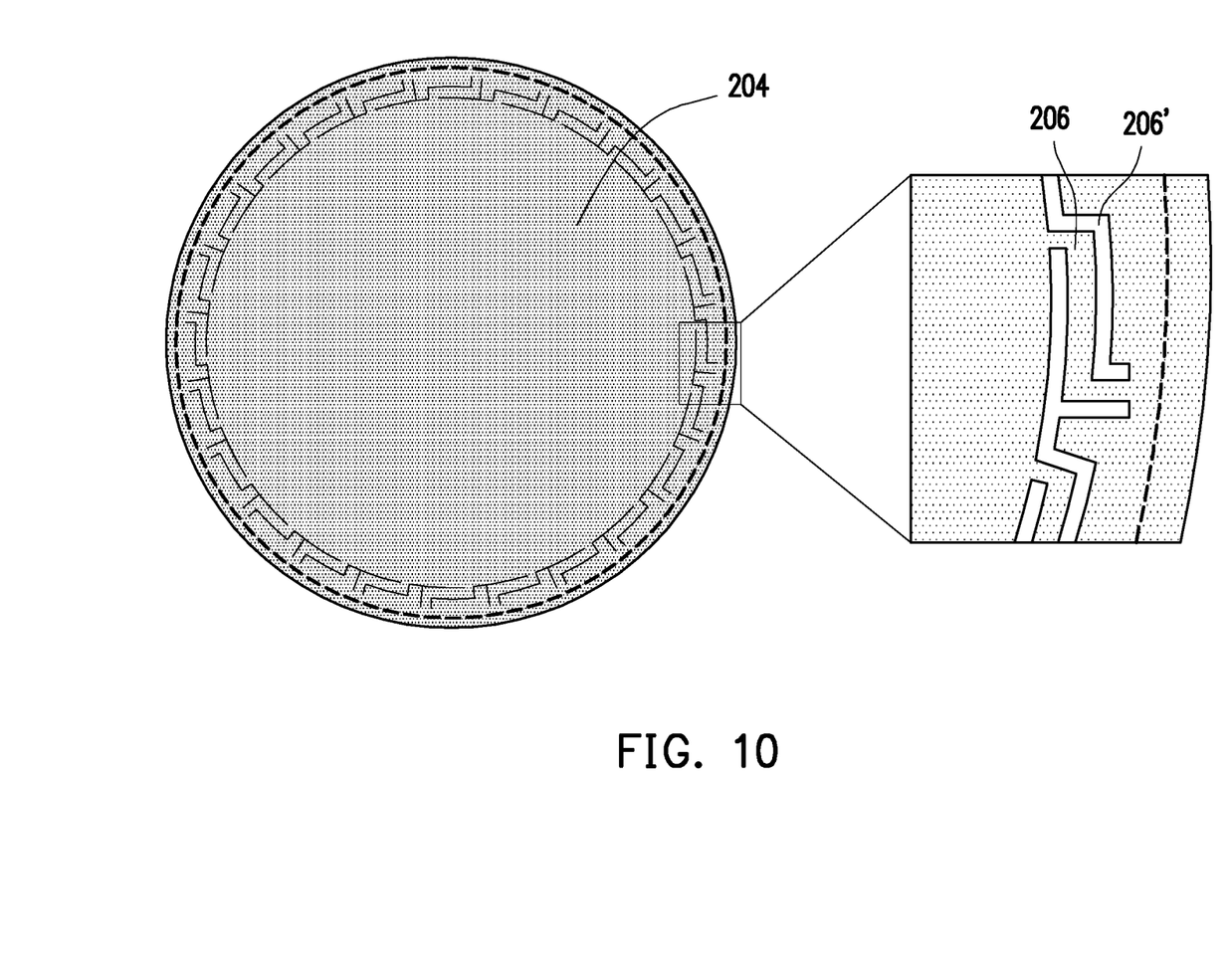

FIG. 9 and FIG. 10 are a drawing, schematically illustrating a top view of the diaphragm of the MEMS microphone, according to an embodiment of the invention. In FIG. 9, the spring structure 206 is not just limited to the structure in FIG. 8A and can be modified into other meandering manners. The adjacent two meandering spring structures 206 may have a common portion. In generally, the openings 206' are formed in peripheral region of the diaphragm 204 to form the spring structure 206.

In FIG. 10, the further modification of the spring structure 206 can made with the different pattern of the opening 206'. In other word, the meandering structure of the spring structure 206 is not just limited to the embodiments as provided.

Figure 11:
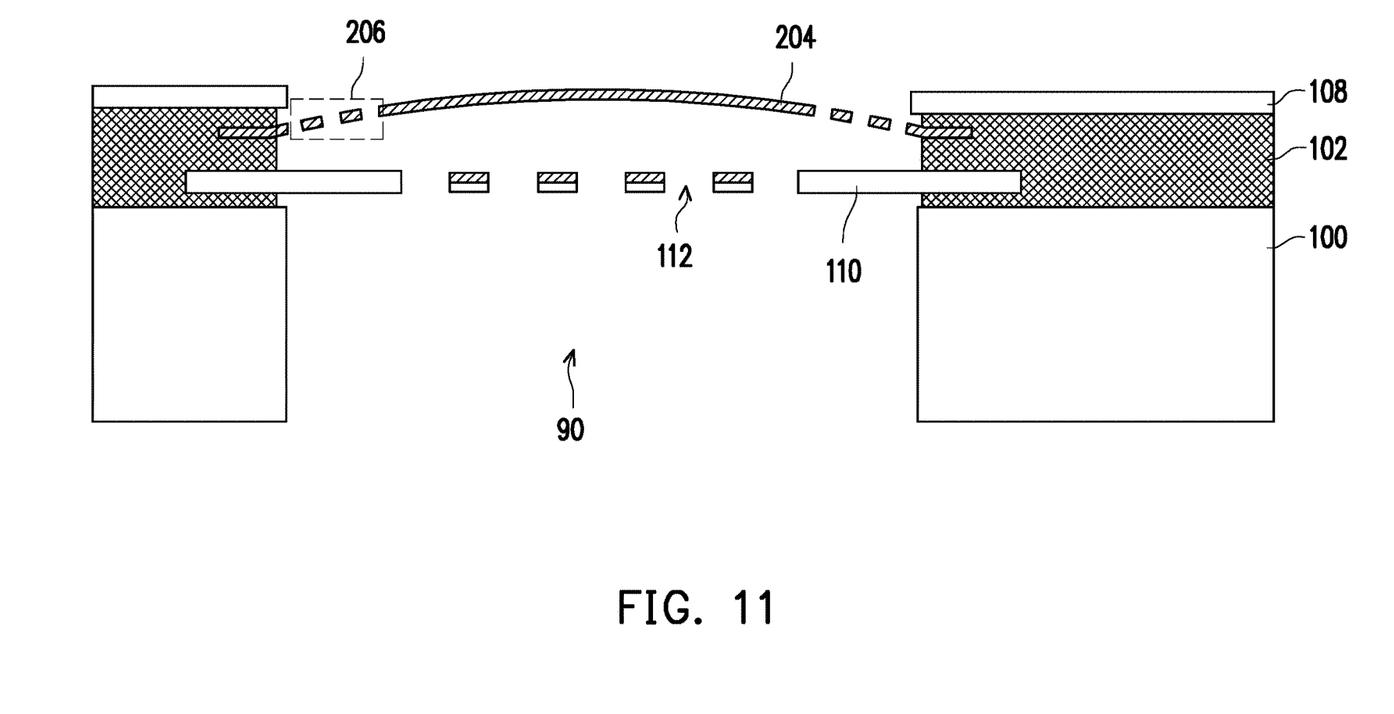
FIG. 11 is a drawing, schematically illustrating a cross-sectional view of a structure of MEMS microphone, according to an embodiment of the invention.

Further modification to the MEMS microphone in FIG. 3, FIG. 11 is a drawing, schematically illustrating a cross-sectional view of a structure of MEMS microphone, according to an embodiment of the invention. In FIG. 11, the diaphragm 204 and the backplate 110 can be flipped with respect to the MEMS microphone in FIG. 3, in which the basic structures are the same. The MEMS microphone includes a substrate 100, having a substrate opening 90. A supporting dielectric layer 102 is disposed on the substrate 100 surrounding the substrate opening 90. A backplate 110 is supported by the supporting dielectric layer 102 over the substrate opening 90. The backplate 90 comprises a plurality of venting holes 112 at a region corresponding to the substrate opening 90. A diaphragm 204 is supported by the supporting dielectric layer 102 over the backplate 110 corresponding to the substrate opening 90. The diaphragm 204 has a bowl-like structure being convex outward the substrate opening 90 when the diaphragm 204 is at an operation off state. A passivation layer is disposed on the supporting dielectric layer 102 and has an opening corresponding to the substrate opening 90 to expose the diaphragm 204.

The property of the diaphragm 204 is also bowl-like similar to the structure in FIG. 3. In this embodiment, the backplate 110 is lower the diaphragm 204 when the substrate 100 serves as the structure base. The features for the bowl depth and the spring structure 206 are similar to the previous descriptions.

The invention has proposed the formation of the diaphragm with the bowl-like structure the convex diaphragm is outward the backplate, so to increase the gap between the backplate and the diaphragm at the center region. The thermal noise can at least be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A micro electro mechanical system (MEMS) microphone, comprising:
   a substrate, having a substrate opening;
   a supporting dielectric layer, disposed on the substrate surrounding the substrate opening;
   a diaphragm, supported by the supporting dielectric layer above the substrate opening, wherein the diaphragm has a bowl-like structure bending as a convex shape toward the substrate opening when the diaphragm is at an operation off state, wherein the bowl-like structure has a central region and has a convex tip in the central region; and
   a backplate, disposed on the supporting dielectric layer over the diaphragm, wherein the backplate comprises a plurality of venting holes at a region corresponding to the substrate opening.

2. The MEMS microphone of claim 1, wherein the diaphragm is distant from the backplate by a first gap at a region supported by the supporting dielectric layer, and the convex tip of the convex shape of the diaphragm is distant from the backplate by a second gap, wherein the second gap is at least 5/4 times of the first gap.

3. The MEMS microphone of claim 2, wherein the larger a diameter of the diaphragm, the larger the second gap is.

4. The MEMS microphone of claim 1, wherein a periphery region of the diaphragm has a spring structure.

5. The MEMS microphone of claim 4, wherein the spring structure is a meandering structure extending from a central region of the diaphragm to a sidewall of the supporting dielectric layer.

6. The MEMS microphone of claim 4, wherein a peripheral region of the diaphragm has a plural of slit openings, so to form the spring structure.

7. The MEMS microphone of claim 1, wherein the backplate comprises a passivation layer, a peripheral region of the passivation layer is disposed on the supporting dielectric layer.

8. The MEMS microphone of claim 1, wherein the diaphragm is conductive.

9. The MEMS microphone of claim 8, wherein the diaphragm is connected to a ground terminal and a conductive layer of the backplate corresponding to the substrate opening is connected to an operation voltage.

10. The MEMS microphone of claim 1, wherein the diaphragm comprises a plurality of sublayers in stack to produce a stress force, so to form the bowl-like structure.

11. A micro electro mechanical system (MEMS) microphone, comprising:
   a substrate, having a substrate opening;
   a supporting dielectric layer, disposed on the substrate surrounding the substrate opening;
   a backplate, supported by the supporting dielectric layer over the substrate opening, wherein the backplate comprises a plurality of venting holes at a region corresponding to the substrate opening;
   a diaphragm, supported by the supporting dielectric layer over the backplate corresponding to the substrate opening, wherein the diaphragm has a bowl-like structure bending as a convex shape outward the substrate opening when the diaphragm is at an operation off state, wherein the bowl-like structure has a central region and has a convex tip in the central region; and
   a passivation layer, disposed on the supporting dielectric layer and having an opening corresponding to the substrate opening.

12. The MEMS microphone of claim 11, wherein the diaphragm is distant from the backplate by a first gap at a region supported by the supporting dielectric layer, and the convex tip of the convex shape of the diaphragm is distant from the backplate by a second gap, wherein the second gap is at least 5/4 times of the first gap.

13. The MEMS microphone of claim 12, wherein the larger a diameter of the diaphragm, the larger the second gap is.

14. The MEMS microphone of claim 11, wherein a periphery region of the diaphragm has a spring structure.

15. The MEMS microphone of claim 14, wherein the spring structure is a meandering structure extending from a central region of the diaphragm to a sidewall of the supporting dielectric layer.

16. The MEMS microphone of claim 14, wherein a peripheral region of the diaphragm has a plural of slit openings, so to form the spring structure.

17. The MEMS microphone of claim 11, wherein the backplate comprises a passivation layer, a peripheral region of the passivation layer is disposed on the supporting dielectric layer.

18. The MEMS microphone of claim 11, wherein the diaphragm is conductive.

19. The MEMS microphone of claim 18, wherein the diaphragm is connected to a ground terminal and a conductive layer of the backplate corresponding to the substrate opening is connected to an operation voltage.

20. The MEMS microphone of claim 11, wherein the diaphragm comprises a plurality of sublayers in stack to produce a stress force, so to form the bowl-like structure.

* * * * *